(12) United States Patent
Banik

(10) Patent No.: US 6,185,720 B1
(45) Date of Patent: Feb. 6, 2001

(54) SLAVELESS SYNCHRONOUS SYSTEM DESIGN

(75) Inventor: Jashojiban Banik, Aloha, OR (US)

(73) Assignee: Intel Corporation, Santa Clara, CA (US)

( * ) Notice: Under 35 U.S.C. 154(b), the term of this patent shall be extended for 0 days.

(21) Appl. No.: 09/100,075

(22) Filed: Jun. 19, 1998

(51) Int. Cl.⁷ ........................................................ G06F 17/50
(52) U.S. Cl. .......................... 716/2; 716/6; 716/8; 716/7; 716/18
(58) Field of Search .......................... 395/500.02–500.19; 716/1–21; 327/215–218

(56) References Cited

U.S. PATENT DOCUMENTS

| | | | |
|---|---|---|---|
| 3,748,498 | * | 7/1973 | Hoffmann ............................. 327/212 |
| 5,396,435 | * | 3/1995 | Ginetti ....................................... 716/6 |
| 5,557,225 | * | 9/1996 | Denham et al. ...................... 327/199 |
| 5,737,237 | * | 4/1998 | Tanaka et al. ............................ 716/9 |
| 5,880,967 | * | 3/1999 | Jyu et al. .................................. 716/6 |

OTHER PUBLICATIONS

Murata et al. ("a novel high–speed latching operation flip–flop (HLO–FF) and its application to a 19–Gb/s decision circuit using a 0.2–um GaAs MESFET", IEEE Journal of Solid–State Circuits, vol. 30, No. 10, Oct. 1995, pp. 1101–1108).*

Yuan et al. ("New single–clock CMOS latches and flipflops with improved speed and power savings", IEEE Journal of Solid–State Circuits, vol. 32, No. 1, Jan. 1997, pp. 62–69).*

Touati et al. ("Computing the initial states of retimed circuits", IEEE Transactions on Computer–Aided Design of Integrated Circuits, vol. 12, No. 1, Jan. 1993, pp. 157–162).*

* cited by examiner

Primary Examiner—Paul R. Lintz
Assistant Examiner—Phallaka Kik
(74) Attorney, Agent, or Firm—Blakely, Sokoloff, Taylor & Zafman LLP

(57) ABSTRACT

An apparatus includes a master latch of a master/slave flip-flop, wherein the master latch includes a first data output. The apparatus also includes a logic coupled to receive the first data output, wherein the logic includes a second data output without using a slave latch of a master/slave flip-flop, and a non-slave latch coupled to receive the second data output.

18 Claims, 6 Drawing Sheets

SLAVELESS SYNCHRONOUS SYSTEM DESIGN

BACKGROUND OF THE INVENTION

1. Field of the Invention

The present invention pertains to the field of digital circuitry. More particularly, this invention relates to slaveless synchronous system design.

2. Background

Computer technology is continually progressing, providing more and more computing power in continually smaller packages. One method employed to obtain this increased power is to place more and more components onto a single integrated circuit (IC) chip. This can be accomplished by reducing the size of the individual components as well as reducing the number of components required to perform various functions. Many of the components on an IC are controlled or "clocked" by a clock signal and are commonly referred to as synchronous components. In general, the clock signal in a device is used to identify when signals are to be transferred between devices.

One component which is commonly used in a wide variety of ICs is a latch. A latch typically stores a single bit of data and is typically controlled by a clock signal. Different types of latches exist which can be used in ICs, including pulse latches and single- and two-phase latches.

It is beneficial to use single- or two-phase latches in some situations, such as when a designer wishes to use the benefits of time borrowing across phases of a clock cycle. However, some problems do exist with their use. One such problem is power consumption. Because there are two portions to the single- and two-phase latches, each activated by different phases of a clock signal, two different types of clock signals must be routed to each of the single- and two-phase latches on the IC. An additional problem is that of clock skew. By requiring the routing of an additional clock signal for the second portion of the latch, as well as the additional load on the clock signal line caused by the second portion of the latch, the skew of the clock signal is increased. Thus, it would be beneficial to provide a way to reduce the effects of the problems associated with using single- and two-phase latches.

As will be described in more detail below, the present invention provides a slaveless synchronous system design that achieves these and other desired results which will be apparent to those skilled in the art from the description to follow.

SUMMARY OF THE INVENTION

A slaveless synchronous system design is described herein. A method is described which checks whether a propagation delay of a data path is longer than a particular time duration. If the propagation delay of the data path is longer than the particular time duration, then a slave latch of a master/slave flip-flop is removed from the data path.

An apparatus is described which includes a master latch of a master/slave flip-flop, wherein the master latch includes a first data output. The apparatus also includes a logic coupled to receive the first data output, wherein the logic includes a second data output without using a slave latch of a master/slave flip-flop, and a non-slave latch coupled to receive the second data output.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1A:
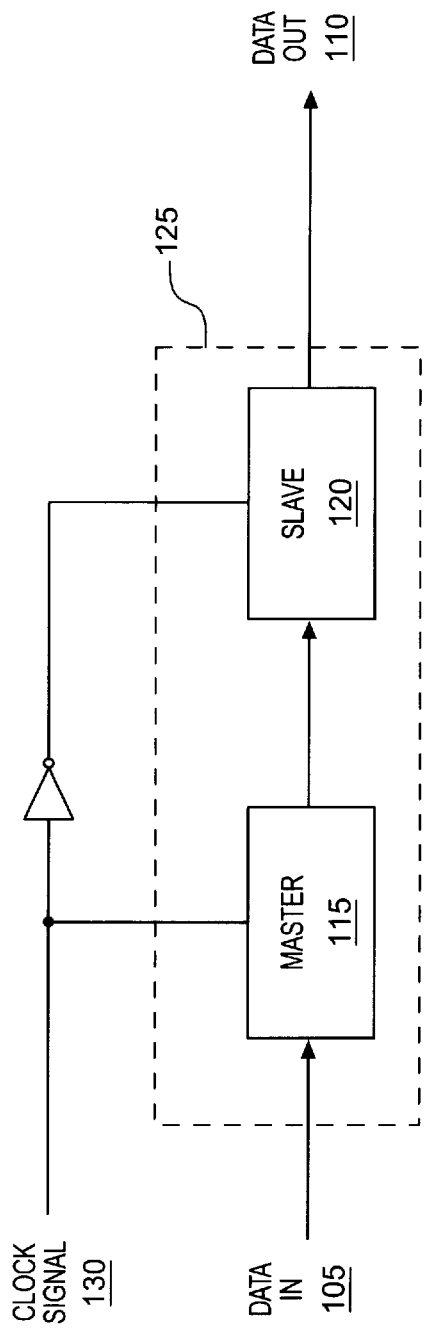
FIGS. 1a and 1b are block diagrams illustrating the circuitry for possible data paths according to one embodiment of the present invention.

In the following detailed description numerous specific details are set forth in order to provide a thorough understanding of the present invention. However, it will be understood by those skilled in the art that the present invention may be practiced without these specific details. In other instances, well known methods, procedures, components, and circuits have not been described in detail so as not to obscure aspects of the present invention.

In the descriptions which follow reference is made to logical zeroes and logical ones. A logical zero is often represented by a voltage of between 0.0 and 0.5 volts. When a particular signal or node is a logical zero, the signal or node is referred to as being low or in a low state. A logical one is often represented by a voltage of between 1.8 and 5.5 volts. When a particular signal or node is a logical one, the signal or node is referred to as being high or in a high state. It is to be appreciated, however, that the voltages which represent a logical zero or a logical one can be different than the ranges mentioned above.

Also in the descriptions which follow reference is made to pulse latches, single-phase latches, and two-phase latches. Each of these latches is used to store or "latch" data (typically one bit). Pulse latches are controlled (also referred to as clocked) by a pulse signal, while single-phase and two-phase latches are controlled (or clocked) by a clock signal. A typical pulse latch is "active" or "turned on" at one edge of a pulse signal (e.g., the rising edge), and "inactive" or "turned off" at a second edge of the pulse signal (e.g., the falling edge). When the pulse latch is turned on, any data received by the pulse latch is transferred to a storage element of the pulse latch. The value of the data (either a zero or a one) being received by the pulse latch when it turns off is the value stored in the storage element until the next rising edge of the pulse signal. Thus, any changes to the input data will not be stored by the pulse latch while the latch is turned off. Any of a wide variety of pulse latches can be used with the present invention, including pulse latches disclosed in U.S. Pat. No. 5,508,648, entitled "Differential Latch Circuit", which is assigned to the assignee of the present invention.

Both single-phase and two-phase latches have two portions, one portion being driven by a clock signal and a second portion being driven by the inverse of the same clock signal. A master/slave flip-flop is an example of a single-phase and a two-phase latch. A master/slave flip-flop contains a first portion (the master) and a second portion (the slave), each of which is substantially the same. Both the master and the slave portions of a master/slave flip-flop behave as a latch, storing data received during one phase of a clock cycle and being unaffected by data during the other phase of the clock cycle. At one edge of the clock signal (e.g., the rising edge), the master turns off and the slave turns on. Thus, the data which has been input to the master is transferred to the slave. At the next edge of the clock signal (e.g., the next falling edge), the master turns on and the slave turns off. Thus, the data which has been input to the slave is maintained after the next edge despite any changes to the data which are input to the master. Any of a wide variety of conventional master/slave flip-flops can be used with the present invention. Master/slave flip-flops are well known to those skilled in the art and thus will not be discussed further except as they pertain to the present invention.

A single-phase latch differs from a two-phase latch in that additional logic is situated between the two portions of the two-phase latch. By way of example, for a single-phase master/slave flip-flop, the output of the master portion is directly coupled to the input of the slave portion. No additional logic exists between the master and slave portions. However, for a two-phase master/slave flip-flop, the output of the master portion is not directly coupled to the input of the slave portion. Rather, the output of the master portion is provided to additional logic, the output of which is directly coupled to the input of the slave portion.

Reference is also made herein to a data path. A data path refers to the circuitry through which a data signal(s) flows, including latches, combinatorial logic, buffers, inverters, additional gates, etc.

Figure 1B:
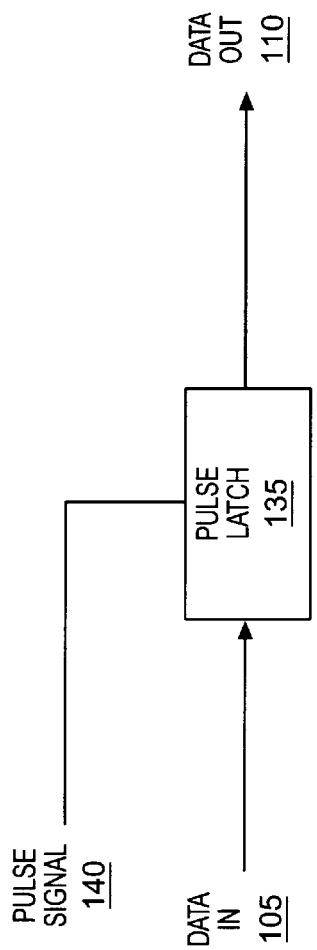

FIGS. 1a and 1b are block diagrams illustrating the circuitry for possible data paths according to one embodiment of the present invention. As illustrated in FIG. 1a, input data 105 is provided to a master portion 115 of a master/slave flip-flop 125. The output from master portion 115 is provided directly to slave portion 120 of flip-flop 125, which in turn provides output data 110. A clock signal is input to and controls or clocks master portion 115. The clock signal is inverted prior to being input to and clocking slave portion 120. As illustrated, no additional logic is situated between master portion 115 and slave portion 120 of flip-flop 125. Thus, flip-flop 125 is a single-phase latch.

FIG. 1b illustrates a reconfiguration of the data path of FIG. 1a. Input data 105 is provided to pulse latch 135, which in turn outputs data out 110. Pulse latch 135 is controlled by pulse signal 140. As illustrated, master and slave portions 115 and 120 and the two clock signal paths 115 and 120 of FIG. 1a are replaced by the single pulse latch 135 and single pulse signal 140 of FIG. 1b. Thus, for data paths which include a single-phase latch, the master and slave portions can be removed and a single pulse latch inserted in their place.

Figure 2:
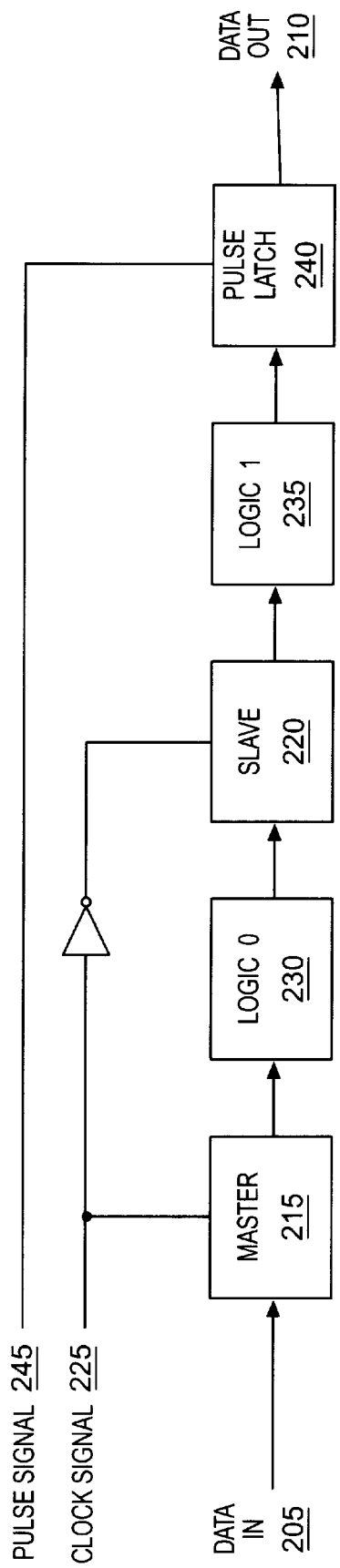
FIG. 2 illustrates a data path including a two-phase latch according to one embodiment of the present invention.

Additional problems and concerns arise when designing a system using a two-phase latch rather than a single-phase latch. FIG. 2 illustrates a twophase latch including a master portion or master latch 215 and a slave portion or slave latch 220. Input data 205, either a logical zero or a logical one, is provided to master portion 215, which outputs data 205 to logic 230. The timing of when master portion 215 switches from outputting the previously stored value of input data 205 to the newly latched value of input data 205 is dependent on, and thus controlled by, clock signal 225. The output of logic 230 is input to slave portion 220, which outputs data to logic 235. The timing of when slave portion 220 switches from outputting the previously stored value from logic 230 to the newly latched value from logic 230 is dependent on, and thus controlled by, the inverse of clock signal 225. Logic 235 outputs data to pulse latch 240, which in turn provides output data 210. The timing of when pulse latch 240 switches from providing the previously latched value from logic 235 is dependent on, and thus controlled by, pulse signal 245.

Logic 230 and 235 of FIG. 2 represents any of a wide variety of conventional logic, including combinatorial logic such as logical AND and logical NAND gates, logical OR gates, etc., as well as buffers, inverters, other gates, etc. It is to be appreciated that the exact type of logic that is to be used as logic 230 and 235, and its functionality, is dependent on the nature of the system into which the data path is being placed as well as the purpose of the data path.

Figure 3:
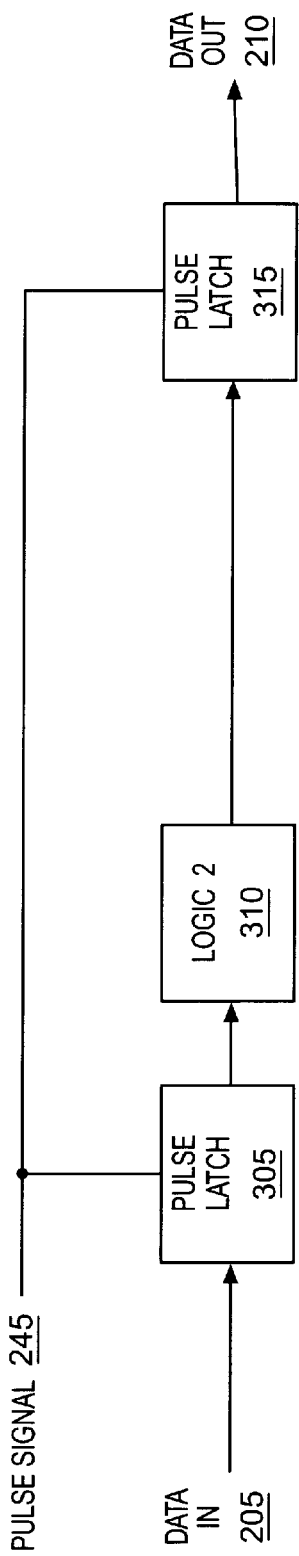
FIG. 3 illustrates a reconfiguration of the data path of FIG. 2 according to one embodiment of the present invention.

FIG. 3 illustrates a reconfiguration of the data path of FIG. 2 according to one embodiment of the present invention. In the illustrated embodiment, input data 205 is provided to pulse latch 305, which outputs data 205 to logic 310. Logic 310 in turn provides its output to pulse latch 315, which provides output data 210. Both pulse latches 305 and 315 are controlled by pulse signal 245. Logic 310 is functionally equivalent to the combination of logic 230 and 235 of FIG. 2. According to one implementation, this functional equivalency is obtained by simply providing the same logic as logic 230 and 235 and providing the output of logic 230 directly into the input of logic 235 (rather than placing a slave portion in between as is done in FIG. 2). In an alternate implementation, depending on the specific logic used as logic 230 and 235, certain logic elements may be combined or altered, thereby reducing the number of gates required for logic 310.

Thus, as can be seen in FIG. 3, the master portion 215 and slave portion 220 have been replaced by a single pulse latch 305. The use of a single pulse latch rather than both master and slave latches reduces the number of gates used in the data path, as well as the number of control signal paths required. As illustrated in FIG. 2, three control signal paths are required: a path for pulse signal 245 input to pulse latch 240, a path for clock signal 225 input to master portion 215, and a path for the inverse of clock signal 225 input to slave portion 220. However, as illustrated in FIG. 2, only two control signal paths are required: a path for pulse signal 245 input to pulse latch 305, and a path for pulse signal 245 input to pulse latch 315.

Figure 4:
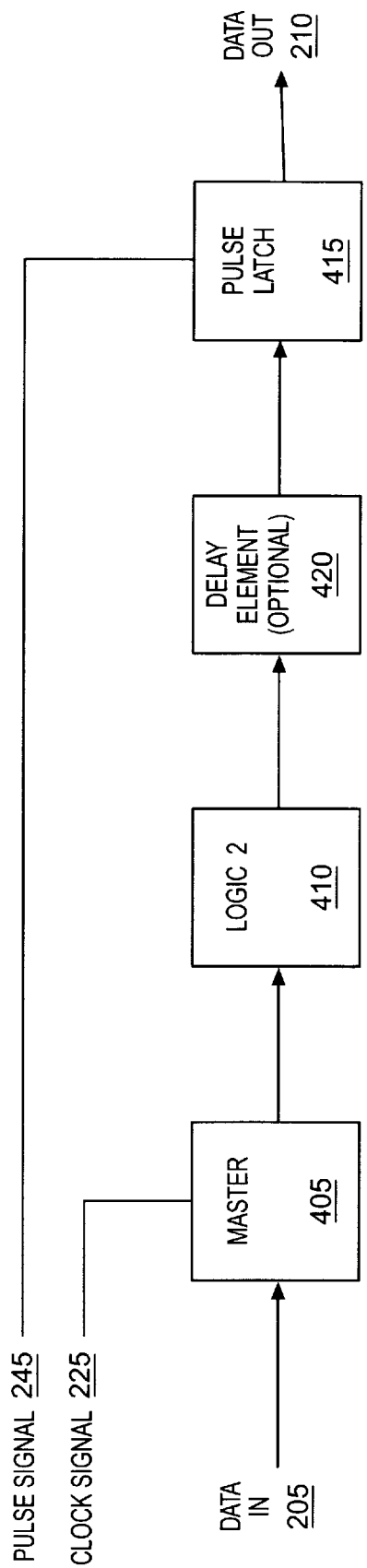
FIG. 4 illustrates a reconfiguration of the data path of FIG. 2 according to another embodiment of the present invention.

FIG. 4 illustrates a reconfiguration of the data path of FIG. 2 according to another embodiment of the present invention. In the illustrated embodiment, input data 205 is provided to master portion or master latch 405, which outputs data 205, under the control of clock signal 225, to logic 410. Logic 410 in turn provides its output to pulse latch 415, which outputs data 210, under the control of pulse signal 245. Analogous to logic 310 of FIG. 3, logic 410 is functionally equivalent to the combination of logic 230 and 235 of FIG. 2.

Thus, as can be seen in FIG. 4, the master portion 215 of FIG. 2 remains, however the slave portion 220 is no longer needed. Several advantages are obtained by removing the slave portion in accordance with the present invention. These advantages include a reduction in the required chip area for the data path due to both the lack of the slave portion itself as well as the lack of an inverted clock signal being routed to the slave portion. Additionally, removing the slave portion results in fewer gates in the data path and thus reduces the data propagation time through the data path. Furthermore, by removing the slave portion, the load on clock signal 225 is reduced, thereby reducing the skew of the clock signal. Additionally, removing the slave portion results in fewer gates, and thus reduced power consumption of the circuit including the data path.

FIG. 4 also includes an optional delay element 420. Whether delay element 420 is necessary is dependent on the timing of logic 410. If logic 410 is fast, then it is possible that a race condition can occur. For example, new data from master portion 405 may propagate through logic 410 prior to pulse latch 415 latching in the previous data. Thus, an additional delay element 420 is added to delay the data propagation, thereby delaying the arrival of the new data to pulse latch 415 until after it has already latched in the previous data. Any of a wide variety of conventional delay elements or methods (e.g., a specific delay device or a lengthening of the trace) could be used as delay element 420.

It should be noted that typically the longer data paths in an IC cause a reduction in the overall operating speed or frequency of the IC rather than the shorter paths. Thus, reducing the delay in data paths of an IC by removing the slave portions results in an increased speed of the IC.

It should be noted that a slave portion can be situated between two logic portions, as is illustrated in FIG. 2, because the system designer is attempting to make use of various design "tricks" to improve system performance, such as time borrowing. Time borrowing refers to the ability to "borrow" portions of a previous clock cycle phase(s) in order to carry out the desired function. Time borrowing is well-known to those skilled in the art and thus will not be discussed further except as it pertains to the present invention. As illustrated in the embodiment of FIG. 4, the logic before and after the slave portion has been combined and any change in timing due to the latching of data by the slave portion has been eliminated. Thus, the present invention allows the elimination of the slave portion while at the same time allowing the benefits of time borrowing to be used.

It is to be appreciated that the more slave latches which are removed in accordance with the present invention, the greater the reduction in overall power consumption of the IC.

Figure 5:
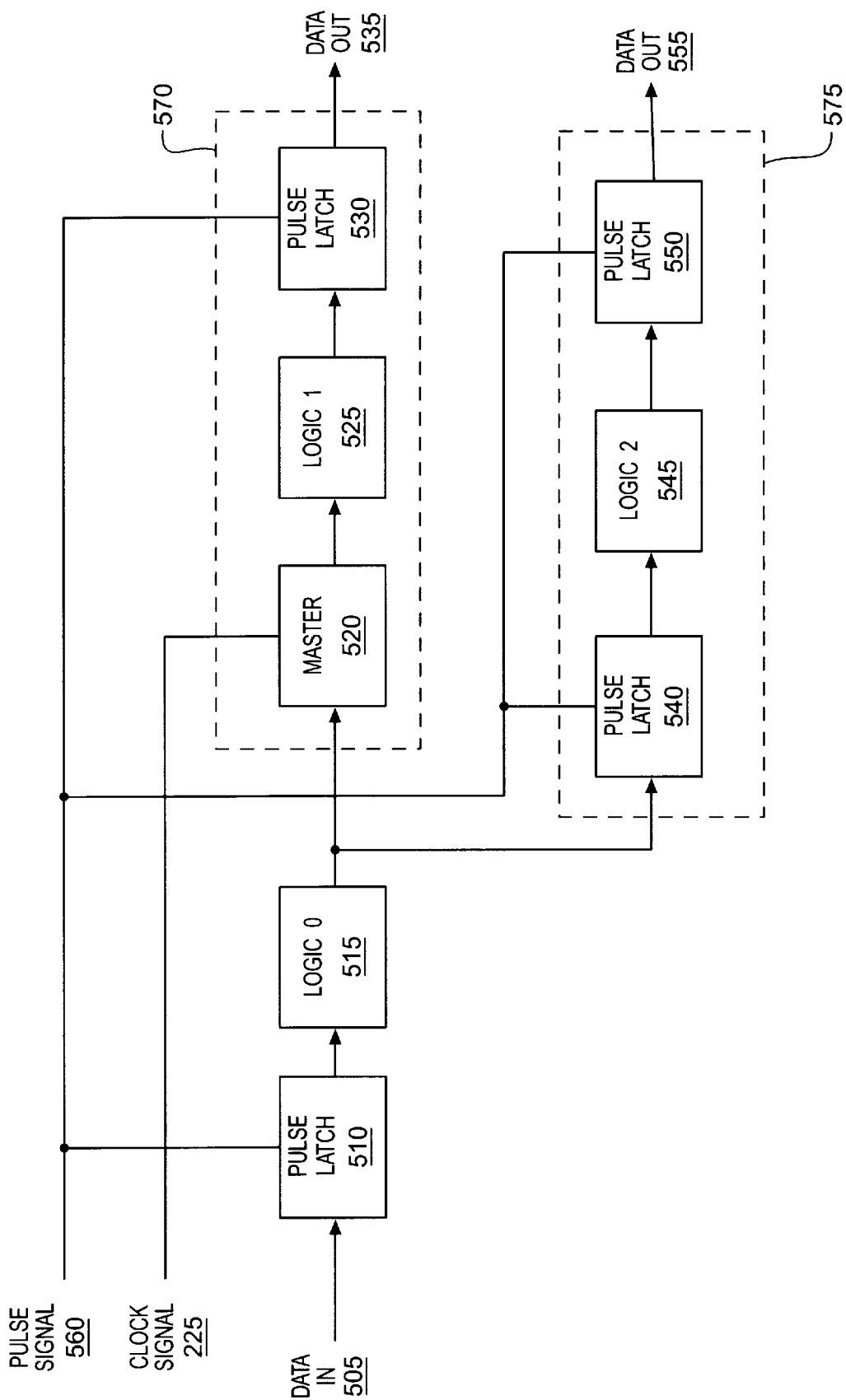
FIG. 5 illustrates multiple data paths each incorporating an embodiment of the present invention.

FIG. 5 illustrates multiple data paths each incorporating one embodiment of the present invention. As illustrated, input data 505 is provided to a pulse latch 510, which provides data 505 to logic 515. The output of logic 515 is provided to both a master portion 520 and a pulse latch 540 as illustrated. Master portion 520 outputs data to logic 525, which in turn provides its output to pulse latch 530. The data output 535 is provided from pulse latch 530. Similarly, pulse latch 540 provides its output to logic 545, which in turn provides its output to pulse latch 550. The data output 555 is provided from pulse latch 550. Clock signal 565 controls master portion 520, while pulse signal 560 controls pulse latches 510, 530, 540, and 550.

As illustrated, master portion 520, logic 525, and pulse latch 530 comprise a long data path 570, and pulse latches 540 and 550 and logic 545 comprise a short data path 575. The two data paths have a common source input data, which is the output of logic 515. Thus, FIG. 5 illustrates two different methods in accordance with the present invention which can be employed to eliminate a slave latch.

Figure 6:
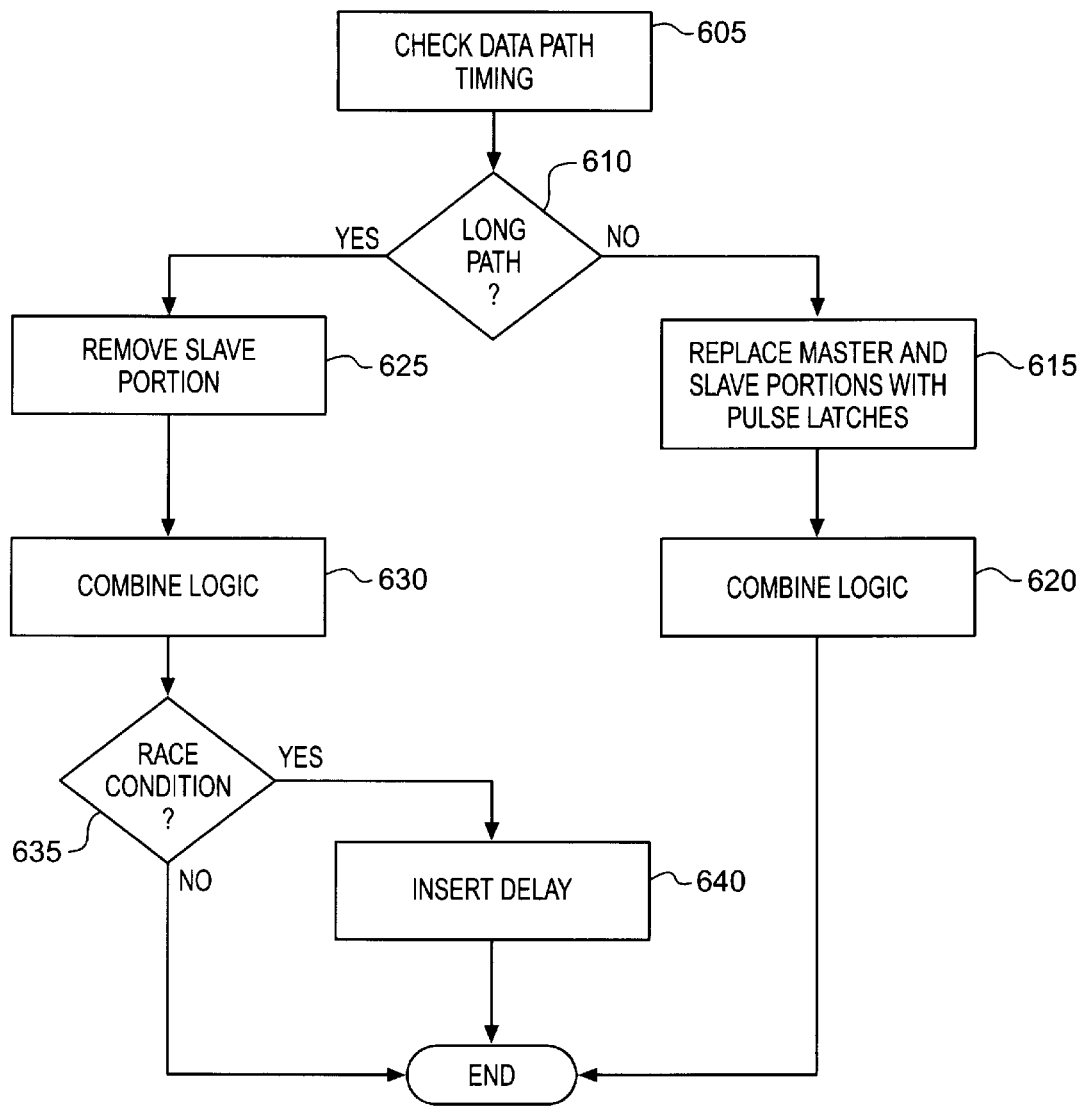
FIG. 6 is a flowchart illustrating the steps followed in eliminating a slave latch from a data path according to one embodiment of the present invention.

FIG. 6 is a flowchart illustrating the steps followed in eliminating a slave latch from a data path according to one embodiment of the present invention. These steps can be carried out by any of a wide variety of conventional circuit design and/or emulation machines or systems, either hard-wired or operatin g under software control. As illustrated, the timing of the data path is checked, step 605. This checking can b e done using any of a wide variety of timing software packages which can simulate the data path, or alternatively by simply estimating the timing based on the gates and/or logic elements involved. The system then checks whether the data path is a long path, step 610. According to one implementation of the present invention, a long path is a data path in which data propagates through the path in one-half clock cycle or more of clock signal 225.

If the data path is not long, the master and slave portions are each replaced with a single pulse latch, step 615, and logic on either side of the slave Portion (if any) is combined, step 620.

Returning to step 6100, if the data path is a long path, then the system removes the slave portion from the data path, step 625, and logic on either side of the slave portion (if any) is combined, step 630. The system then checks whether a race condition will occur, step 635. If not, then the process ends. However, if a race condition will occur then the system inserts an additional delay into the data path, step 640. The process then ends.

According to an alternate embodiment, steps 615 and 620 are carried out regardless of whether the data path is a long path. Thus, in this alternate embodiment, the master and slave portions are replaced with pulse latches without regard for the length of the data path.

Figure 7:
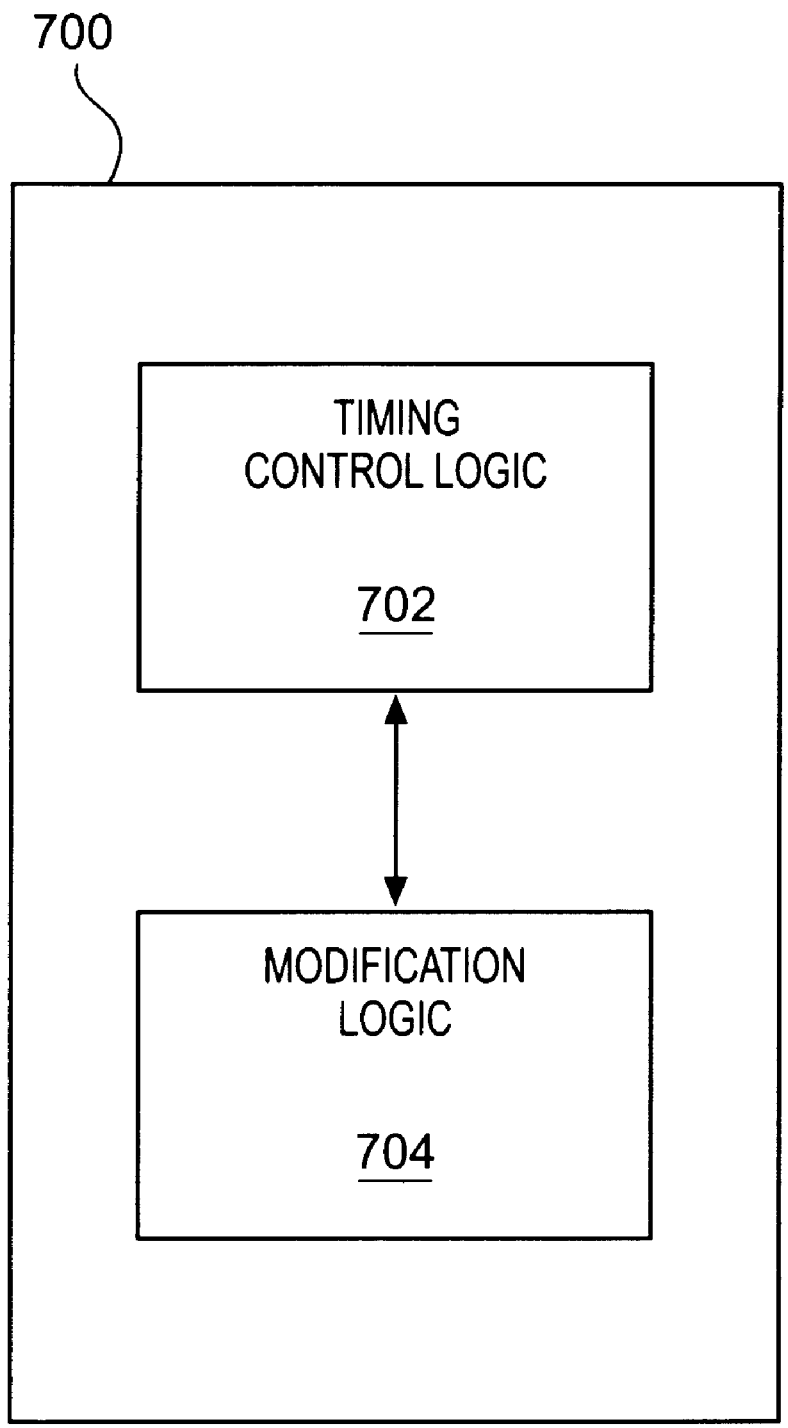
FIG. 7 is a block diagram illustrating a device for carrying out the steps of FIG. 6 according to one embodiment of the present invention.

FIG. 7 is a block diagram illustrating a device for carrying out the steps of FIG. 6 according to one embodiment of the present invention. A device 700 is illustrated including timing control logic 702 and modification logic 704. Timing control logic 702 checks the data path timing in step 605 and provides an indication to modification logic 704 as to whether the data path is a long path. Timing control logic 702 also checks the timing of the data path and provides an indication to modification logic 704 as to whether a race condition exists (step 635). Modification logic 704 is responsible for modifying the data path, including combining logic (steps 620 and 630), removing slave portions (step 625), replacing master and slave portions with pulse latches (step 615), and inserting delay elements (step 640).

The device 700 represents a wide variety of devices in which the present invention can be implemented, including machine-readable media (e.g., conventional storage devices such as a floppy disk, random access memory, or Flash memory), as well as discrete hardware and/or firmware.

In embodiments where the present invention is implemented in hardware, timing control logic 702 includes the logic for carrying out the data path timing of FIG. 6. Similarly, modification logic 704 includes the logic for carrying out the data path modification steps of FIG. 6.

In embodiments where the present invention is implemented in software or firmware, timing control logic 702 includes the instructions, to be executed by a processor, for carrying out the data path timing steps of FIG. 6. Similarly, modification logic 704 includes the instructions, to be executed by a processor, for carrying out the data path modification steps of FIG. 6. In these "software/firmware" embodiments, timing control logic 702 and modification logic 704 are a plurality or series of software instructions, typically organized as a plurality of software routines, that can be executed by a processor of a hardware system. Examples of such hardware systems include general purpose computer systems or workstations based on the Intel Pentium®) processor or Intel Pentium® Pro processor families.

Thus, the present invention allows for the removal of slave latches from data paths in a circuit under certain circumstances. Such removal advantageously results in both a reduction in power consumption of the circuit and an increase in the speed of the circuit.

Thus, a slaveless synchronous system design has been described. Whereas many alterations and modifications of the present invention will be comprehended by a person

What is claimed is:

1. A method comprising:
checking whether a propagation delay of a data path that includes a master/slave flip-flop is longer than a particular time duration; and
if the propagation delay of the data path is longer than the particular time duration, then removing a slave latch of the master/slave flip-flop from the data path by routing output data from a master latch of the master/slave flip-flop to a pulse latch.

2. The method of claim 1, further comprising:
if the propagation delay of the data path is shorter than the particular time duration, then replacing each of the master latch of the master/slave flip-flop and the slave latch of the master/slave flip-flop with a pulse latch.

3. The method of claim 1, further comprising:
adding a delay element to the data path if the data path is shorter than a second time duration.

4. The method of claim 1, wherein the removing of the slave latch from the data path results in a new data path including:
a master latch of the maser/slave flip-flop outputting first data;
a logic receiving the first data, the logic outputting second data without using the slave latch; and
a pulse latch coupled to receive the second data.

5. An apparatus comprising:
timing control logic to check whether a propagation delay of a data path is longer than a particular time duration; and
modification logic, coupled to the timing control logic, to reconfigure the data path by removing a slave latch of a master/slave flip-flop from the data path if the propagation delay of the data path is longer than the particular time duration and route output data from a master latch of the master/slave flip-flop to a pulse latch.

6. The apparatus of claim 5, wherein the modification logic is further to replace each of the master latch of the master/slave flip-flop and the slave latch of the master/slave flip-flop with a pulse latch if the propagation delay of the data path is shorter than the particular time duration.

7. The apparatus of claim 5, wherein the modification logic is further to add a delay element to the data path if the data path is shorter than a second time duration.

8. The apparatus of claim 5, wherein the modification logic, in removing the slave latch from the data path, is to create a new data path including:
a master latch of the master/slave flip-flop to provide a first data output;
a logic coupled to receive the first data output, the logic to provide a second data output without using the slave latch; and
a pulse latch coupled to receive the second data output.

9. A method comprising:
identifying a data path in a hardware design that includes a master/slave flip-flop, the master/slave flip-flop having a master latch and a slave latch; and
reconfiguring the data path by removing at least the slave latch and combining logic, if any, on either side of the slave latch.

10. The method of claim 9, further comprising replacing each of the master latch of the master/slave flip-flop and the slave latch of the master/latch flip-flop with a pulse latch.

11. The method of claim 9, wherein the removing of the slave latch from the data path results in a new data path including:
a master latch of the master/slave flip-flop outputting a first data;
a logic receiving the first data, the logic outputting second data without using the slave latch; and
a pulse latch coupled to receive the second data.

12. A machine-readable medium having stored thereon data representing sequences of instruction which, when executed on a general purpose machine, perform slaveless synchronous system design by:
checking whether a propagation delay of a data path that includes a master/slave flip-flop is longer than a particular time duration; and
if the propagation delay of the data path is longer than the particular time duration, then removing a slave latch of the master/slave flip-flop from the data path by routing output data from a master latch of the master/slave flip-flop to a pulse latch.

13. The machine-readable medium of claim 12, further comprising:
if the propagation delay of the data path is shorter than the particular time duration, then replacing each of the master latch of the master/slave flip-flop and the slave latch of the master/slave flip-flop with a pulse latch.

14. The machine-readable medium of claim 12, further comprising:
adding a delay element to the data path if the data path is shorter than a second time duration.

15. The machine-readable medium of claim 12, wherein the removing of the slave latch from the data path results in a new data path including:
a master latch of the maser/slave flip-flop outputting first data;
a logic receiving the first data, the logic outputting second data without using the slave latch; and
a pulse latch coupled to receive the second data.

16. A machine-readable medium having stored thereon data representing sequences of instructions which, when executed by a general purpose machine, perform slaveless synchronous system design by:
identifying a data path in a hardware design that includes a master/slave flip-flop, the master/slave flip-flop having a master latch and a slave latch; and
reconfiguring the data path by removing at least the slave latch and combining logic, if any, on either side of the slave latch.

17. The machine-readable medium of claim 16, further comprising replacing each of the master latch of the master/slave flip-flop and the slave latch of the master/latch flip-flop with a pulse latch.

18. The machine-readable medium of claim 16, wherein the removing of the slave latch from the data path results in a new data path including:
a master latch of the master/slave flip-flop outputting a first data;
a logic receiving the first data, the logic outputting second data without using the slave latch; and
a pulse latch coupled to receive the second data.

* * * * *

UNITED STATES PATENT AND TRADEMARK OFFICE
CERTIFICATE OF CORRECTION

PATENT NO. : 6,185,720 B1  
DATED : February 6, 2001  
INVENTOR(S) : Jashojiban Banik Page 1 of 1

It is certified that error appears in the above-identified patent and that said Letters Patent is hereby corrected as shown below:

<u>Column 6,</u>  
Line 10, delete "6100" and insert -- 610 --.

Signed and Sealed this

Thirtieth Day of April, 2002

Attest:

*Attesting Officer*

JAMES E. ROGAN  
*Director of the United States Patent and Trademark Office*